US010540759B2

United States Patent
Sah et al.

(10) Patent No.: US 10,540,759 B2
(45) Date of Patent: Jan. 21, 2020

(54) BONDED WAFER METROLOGY

(71) Applicant: KLA-Tencor Corporation, Milpitas, CA (US)

(72) Inventors: Kaushik Sah, Kessel Lo (BE); Thomas Krah, Friedberg (DE); Shifang Li, Pleasanton, CA (US); Heiko Eisenbach, Elz (DE); Moritz Stoerring, Brussels (BE)

(73) Assignee: KLA-Tencor Corporation, Milpitas, CA (US)

( * ) Notice: Subject to any disclaimer, the term of this patent is extended or adjusted under 35 U.S.C. 154(b) by 213 days.

(21) Appl. No.: 15/627,834

(22) Filed: Jun. 20, 2017

(65) Prior Publication Data
US 2018/0150952 A1    May 31, 2018

Related U.S. Application Data

(60) Provisional application No. 62/427,373, filed on Nov. 29, 2016.

(51) Int. Cl.
| G06K 9/00 | (2006.01) |
| G06T 7/00 | (2017.01) |
| G06T 7/73 | (2017.01) |
| H01L 21/66 | (2006.01) |
| G06T 7/13 | (2017.01) |
| G01B 11/00 | (2006.01) |
| G01B 11/24 | (2006.01) |
| G06T 7/60 | (2017.01) |
| H01L 21/306 | (2006.01) |

(52) U.S. Cl.
CPC .......... *G06T 7/0004* (2013.01); *G01B 11/002* (2013.01); *G01B 11/2433* (2013.01); *G06T 7/13* (2017.01); *G06T 7/60* (2013.01); *G06T 7/73* (2017.01); *H01L 22/12* (2013.01); *G01B 2210/56* (2013.01); *G06T 2207/20061* (2013.01); *G06T 2207/30148* (2013.01); *H01L 21/30625* (2013.01); *H01L 22/20* (2013.01)

(58) Field of Classification Search
None
See application file for complete search history.

(56) References Cited

U.S. PATENT DOCUMENTS

| 6,901,171 | B1 | 5/2005 | Dutta-Choudhury et al. |
| 7,477,372 | B2 * | 1/2009 | Leslie ............. G01N 21/94 356/237.2 |
| 7,576,849 | B2 | 8/2009 | Wagner |

(Continued)

OTHER PUBLICATIONS

ISA/KR, International Search Report for PCT/US2017/063310 dated Jun. 20, 2018.

*Primary Examiner* — Randolph I Chu
(74) *Attorney, Agent, or Firm* — Hodgson Russ LLP

(57) ABSTRACT

Wafer edge profile images are analyzed at locations around a bonded wafer, which may have a top wafer and a carrier wafer. An offset curve is generated based on the wafer edge profile images. Displacement of the top wafer to the carrier wafer is determined based on the offset curve. The wafer edge profile images may be generated at multiple locations around the wafer. The wafer edge profile images may be shadowgram images. A system to determine displacement of the top wafer to the carrier wafer can include an imaging system connected with a controller.

17 Claims, 13 Drawing Sheets

(56) References Cited

U.S. PATENT DOCUMENTS

| | | |
|---|---|---|
| 7,616,804 B2 | 11/2009 | Pai et al. |
| 8,115,169 B2 | 2/2012 | Toyoda et al. |
| 8,629,902 B2 | 1/2014 | Lewis et al. |
| 9,354,047 B2 * | 5/2016 | Kannaka ............... G01B 11/272 |
| 2002/0025652 A1 * | 2/2002 | Yanagita ........... H01L 21/67092 |
| | | 438/406 |
| 2003/0169916 A1 | 9/2003 | Hayashi et al. |
| 2005/0036671 A1 | 2/2005 | Watkins et al. |
| 2006/0109484 A1 | 5/2006 | Akamatsu |
| 2009/0142916 A1 | 6/2009 | Prenz et al. |
| 2010/0134615 A1 | 6/2010 | Akamatsu et al. |
| 2012/0092635 A1 * | 4/2012 | Solak .................. G03F 7/70408 |
| | | 355/67 |
| 2012/0195490 A1 * | 8/2012 | Langmans ............ G06T 7/0004 |
| | | 382/149 |
| 2013/0054154 A1 | 2/2013 | Broekaart et al. |
| 2013/0100441 A1 | 4/2013 | Tagawa et al. |
| 2015/0016943 A1 | 1/2015 | Hsieh et al. |
| 2015/0243018 A1 * | 8/2015 | Vajaria .................. G06T 7/0004 |
| | | 382/133 |
| 2015/0370175 A1 | 12/2015 | Nicolaides et al. |
| 2016/0091437 A1 | 3/2016 | Horn |

\* cited by examiner

BONDED WAFER METROLOGY

CROSS-REFERENCE TO RELATED APPLICATIONS

This application claims priority to the provisional patent application filed Nov. 29, 2016 and assigned U.S. App. No. 62/427,373, the disclosure of which is hereby incorporated by reference.

FIELD OF THE DISCLOSURE

This disclosure relates to wafer metrology.

BACKGROUND OF THE DISCLOSURE

Fabricating semiconductor devices, such as logic and memory devices, typically includes processing a substrate like a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Bonded (or stacked) wafers are frequently used in the semiconductor industry. One or more ultrathin wafers bonded to a carrier wafer is an example of a bonded wafer, though other semiconductor wafer designs also can be bonded wafers. For example, a bonded wafer can include a top wafer (e.g., a device wafer) bonded to a carrier wafer. These bonded wafers can be used for both memory and logic applications. Three-dimensional integrated circuits (3D IC) can be produced using bonded wafers.

Bonded wafers can have complex edge profiles. The various layers of a bonded wafer can have different heights and diameters. These dimensions can be affected by the size of the various wafers prior to stacking or by processing steps.

Bonded wafers with fabrication errors can cause problems during manufacturing. For example, centricity of the bonded wafer affects the CMP process or increases handling risks. During CMP, centricity affects placement of the polishing pad with respect to the center of the bonded wafer and subsequent planarization. During wafer handling, the balance of a bonded wafer or clearance within manufacturing equipment can be affected by centricity of the bonded wafer.

Improper centricity can even ruin a bonded wafer or damage manufacturing equipment. If the bonded wafer is undercut, improperly bonded together, or contains too much glue, then the bonded wafer can break within the CMP tool, contaminating or damaging the CMP tool. Such contamination or damage leads to unwanted downtime or can even stop production within a semiconductor fab.

Furthermore, a CMP process on a bonded wafer with improper centricity can result in undesired edge profiles on the bonded wafer. For example, too much or not enough material may be removed during a CMP process or the CMP process may result in undercuts, overhangs, or whiskers. These undesired edge profiles can affect device yield or can impact later manufacturing steps.

Therefore, what is needed are improved techniques for bonded wafer metrology and associated systems.

BRIEF SUMMARY OF THE DISCLOSURE

A metrology system is provided in a first embodiment. The metrology system comprises a stage configured support a bonded wafer, an imaging system configured to generate wafer edge profile images of a circumferential edge of the bonded wafer, and a controller in electronic communication with the imaging system. The bonded wafer has a top wafer disposed on a carrier wafer. The imaging system includes a light source configured to generate collimated light and a detector configured to generate the wafer edge profile images. The controller is programmed to: analyze the wafer edge profile images at a plurality of locations around the bonded wafer; generate an offset curve based on the wafer edge profile images; and determine a displacement of the top wafer to the carrier wafer based on the offset curve. The wafer edge profile images may be shadowgram images.

During the analyzing, the controller can be further configured to: determine a first vertical line segment in each of the edge profile images for the top wafer; determine a second vertical line segment in each of the edge profile images for the carrier wafer; and compare the lateral position of the first vertical line segment and the second vertical line segment for each of the edge profile images.

During the analyzing, the controller also can be further configured to: extract edge coordinates from each of the edge profile images; determine coordinates of points at a bevel and an apex in each of the edge profile images; fit the coordinates to an elliptical model; and calculate a center position of the top wafer and the carrier wafer.

In a second embodiment, a method is provided. The method comprises: analyzing, with a controller, wafer edge profile images at a plurality of locations around a bonded wafer; generating, with the controller, an offset curve based on the wafer edge profile images; and determining, with the controller, a displacement of the top wafer to the carrier wafer based on the offset curve. The bonded wafer has a top wafer disposed on a carrier wafer. The wafer edge profile images may be shadowgram images.

The wafer edge profile images can be generated at the plurality of locations around the bonded wafer.

The analyzing can further include: determining a first vertical line segment in each of the edge profile images for the top wafer; determining a second vertical line segment in each of the edge profile images for the carrier wafer; and comparing the lateral position of the first vertical line segment and the second vertical line segment for each of the edge profile images. Determining the first vertical line segment and determining the second vertical line segment can include isolating vertically connected pixels along a contour of the wafer edge profile images using a Hough Transform. A sinusoidal model may be used to determine the displacement.

The analyzing also can further include: extracting edge coordinates from each of the edge profile images; determining coordinates of points at a bevel and an apex in each of the edge profile images; fitting the coordinates to an elliptical model; and calculating a center position of the top wafer and the carrier wafer. Stage effects can be corrected for after the extracting.

A shape of an edge profile of the top wafer and the carrier wafer also can be evaluated.

In a third embodiment, a non-transitory computer readable medium storing a program is provided. The non-transitory computer readable medium configured to instruct a processor to: analyze wafer edge profile images at a plurality of locations around a bonded wafer; generate an offset curve based on the wafer edge profile images; and determine a displacement of the top wafer to the carrier wafer based on the offset curve. The bonded wafer has a top wafer disposed on a carrier wafer. The wafer edge profile images may be shadowgram images.

Analyzing the displacement can include: determining a first vertical line segment in each of the edge profile images for the top wafer; determining a second vertical line segment in each of the edge profile images for the carrier wafer; and comparing the lateral position of the first vertical line segment and the second vertical line segment for each of the edge profile images. Determining the first vertical line segment and determining the second vertical line segment can include isolating vertically connected pixels along a contour of the wafer edge profile images using a Hough Transform. A sinusoidal model may be used to determine the displacement.

Analyzing the displacement also can include: extracting edge coordinates from each of the edge profile images; determining coordinates of points at a bevel and an apex in each of the edge profile images; fitting the coordinates to an elliptical model; and calculating a center position of the top wafer and the carrier wafer. Stage effects can be corrected for after the extracting.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

As part of 3D-integration process, semiconductor wafers can be stacked and bonded together. At least one top wafer, which may be a device wafer or some other type of wafer, is placed on a carrier wafer. The top wafer and the carrier wafer can be connected by an adhesive material. Several process parameters such as an amount of adhesive, force, temperature, wafer shape, and placement accuracy may cause a wafer displacement between the top wafer and the carrier wafer, such as the carrier wafer and the top wafer not being centered relative to each other. Methods and systems to measure wafer-to-wafer displacement of two or more wafers (e.g., top wafer and carrier wafer) in a bonded wafer are disclosed. For example, displacement in the X and Y dimensions can be determined. The X, Y, and Z coordinates of the wafer edge can be used to determine the center of each of the bonded wafers.

Figure 1:
FIG. 1 is an exemplary wafer edge profile image of a circumferential edge of a bonded wafer.

Wafer edge profile images can be acquired, such as using a system disclosed in U.S. Pat. No. 8,629,902, which is incorporated by reference in its entirety, or other systems. FIG. 1 is an exemplary wafer edge profile image of a circumferential edge of a bonded wafer having a carrier wafer 300 and a top wafer 301. FIG. 1 is an example of a shadowgram image. From the edge contour and the wafer rotation angle, the X, Y, and Z coordinates of the wafer edge are extracted with Z being the thickness of the wafers in the bonded wafer. From these coordinates, the center of each of the bonded wafers can be determined.

In an embodiment, image processing techniques are used to isolate vertically-connected pixels along the contour of the edge profiler image. Based on user-defined zones and slope tolerance parameters, vertically connected pixels (e.g., vertical line segments) are grouped into two regions. One region is associated with the top wafer and the other regions is associated with the carrier wafer. Average X distances of these line segments can then be calculated from the edge of the image frame or some other reference point for the two groups. Absolute offset is calculated as difference between these average values. This is repeated for all wafer edge profile images acquired around the wafer (e.g., every 10 degrees around the circumference of the bonded wafer) to generate an offset curve. A model is then applied to calculate the X and Y offsets between the top wafer and the carrier wafer from this curve.

Figure 2:
FIG. 2 is a contour extracted from the wafer edge profile image of FIG. 1.

An example is illustrated in FIGS. 2-5. FIG. 2 is a contour extracted from the wafer edge profile image of FIG. 1. The wafer edge profile image of FIG. 1 may be sharpened or otherwise cleaned up prior to extraction, such as to remove scale bars. Scale bars may be removed by, for example, cropping the image. Other pre-processing, such as fringe removal, noise filtering, or color depth reduction down to two bit (black and white), also may be performed.

The contour of the edge profile in FIG. 2 may be extracted, such as by using a high pass filter. In an instance, a canny edge extraction method is used during which some smoothing may be performed to avoid noisy edges in the images. Other smoothing may be performed during edge extraction depending on the edge extraction algorithm.

Figure 3:
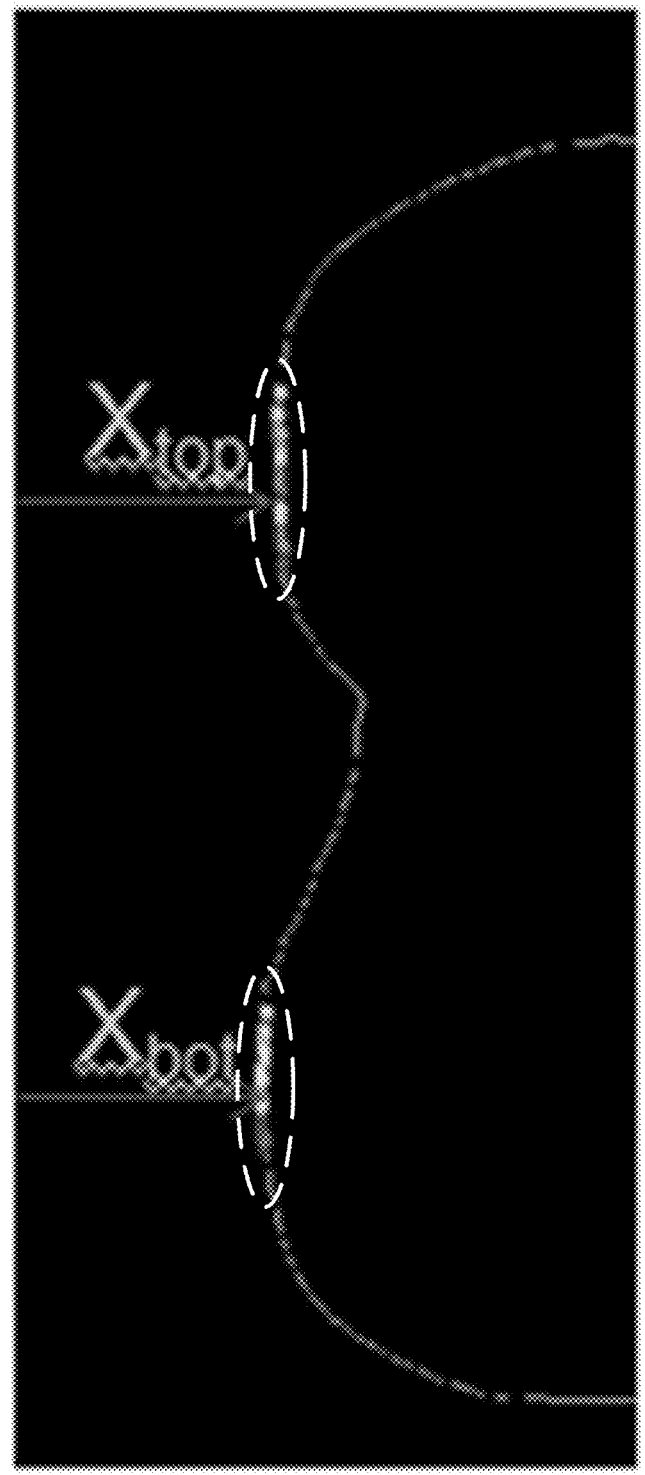
FIG. 3 illustrates vertical line segments of the contour of FIG. 2 after grouping.

FIG. 3 illustrates vertical line segments of the contour shown in FIG. 2 after grouping. The line segments can be grouped into regions associated with the top wafer and the carrier wafer. The vertical line segments represent or approximate an extent of the wafer and are circled in FIG. 3 with a dotted line. $X_{top}$ is an average X distance of the top line segments (e.g., the top wafer) and $X_{bot}$ is an average X distance of the bottom line segments (e.g., the carrier wafer). $X_{top}$ and $X_{bot}$ can be, for example, an average distance from the edge of an image frame or other reference. For example, this may be an average distance with respect to left hand side of image frame. The actual average or reference point for the two averages may not matter because a difference between two averages is used.

A Hough Transform based technique, local slope calculation, or other techniques known in the art may be used to determine vertical line segments on the edge contour. In an instance, the local slope calculation is based on a few pixels and only those pixels are selected whose local slope indicates a vertical edge.

An offset between the two vertical line segments is then calculated. For example, an average X distance from the edge of image frame for lines in each group is calculated based on FIG. 3. A total offset as difference between these two average values is also calculated based on FIG. 3.

Figure 4A:
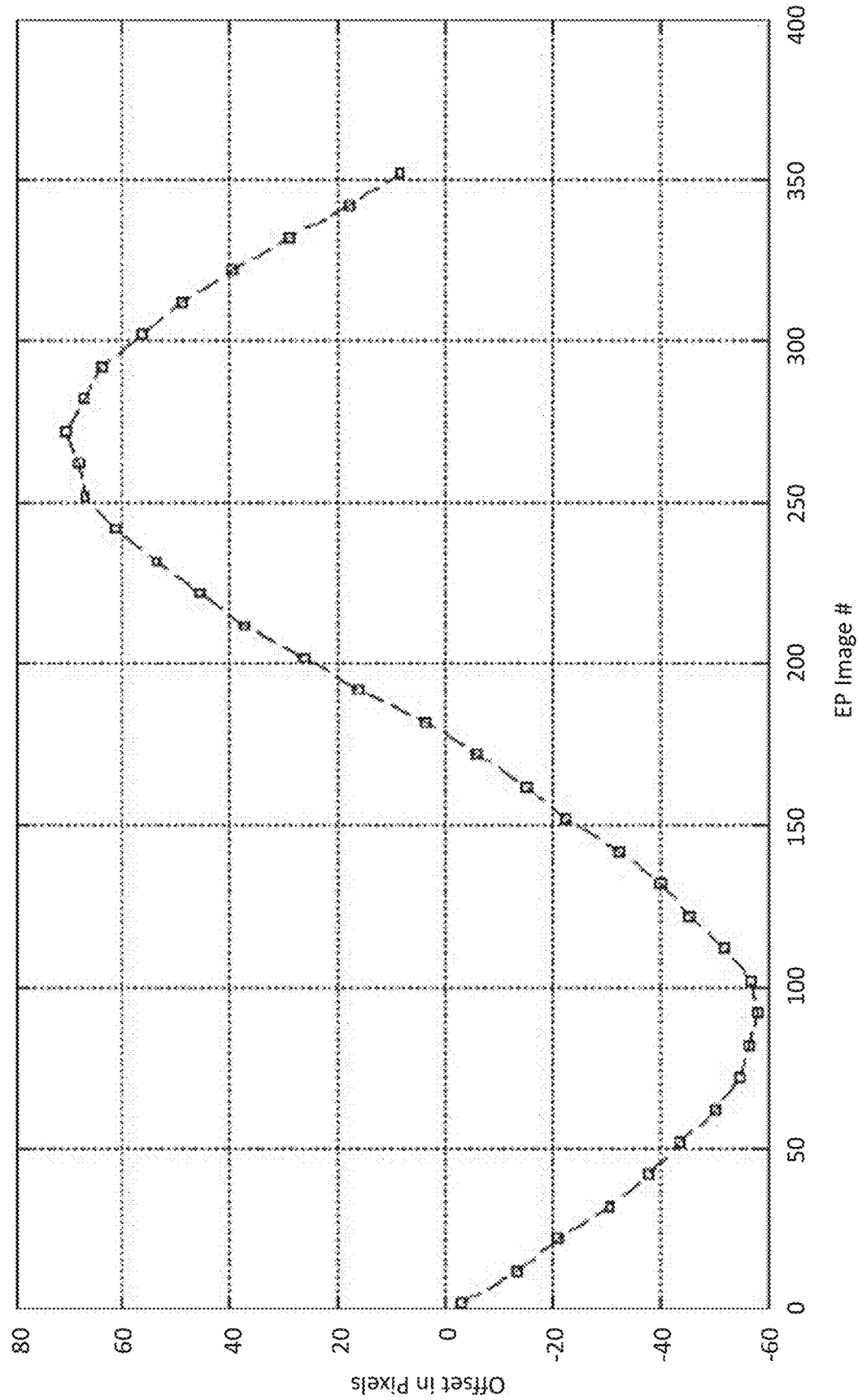
FIGS. 4A and 4B are exemplary offset curves for analyzed images of a wafer.
Figure 4B:
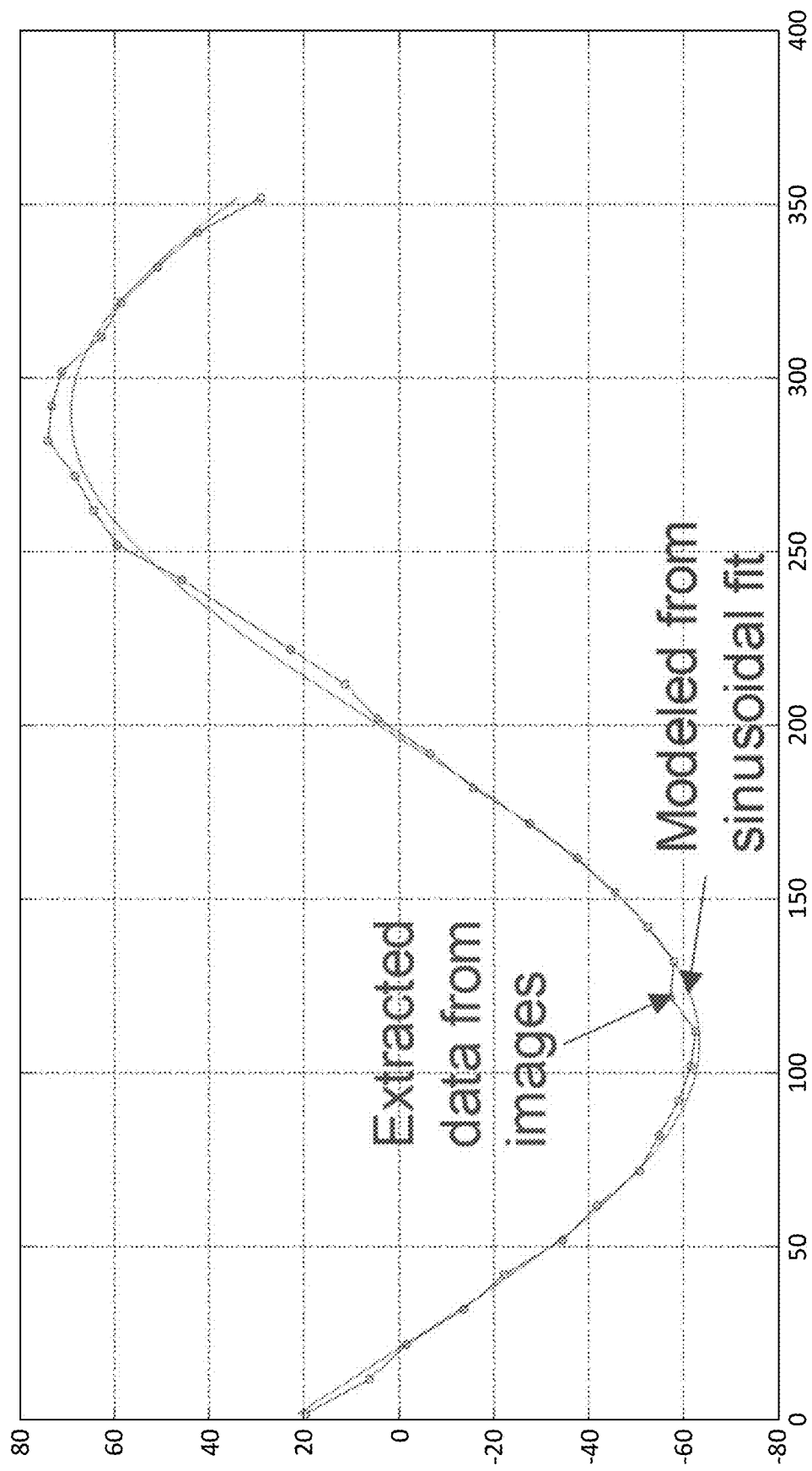
Figure 5:
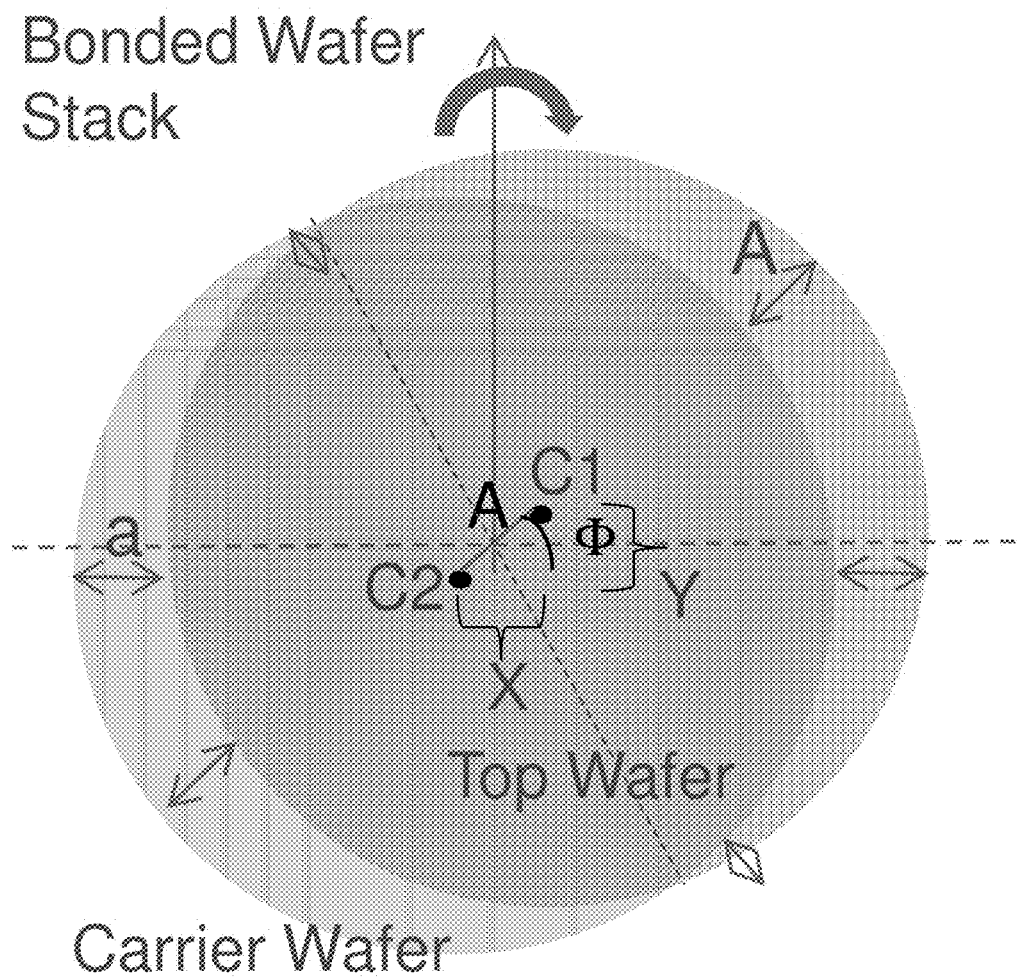
FIG. 5 is a model description in accordance with the present disclosure.

The process in FIGS. 2 and 3 can be repeated for all wafer edge profile images (e.g., every 10 degrees around the circumference of the bonded wafer) and an offset curve is generated. An exemplary offset curve is illustrated in FIGS. 4A and 4B. FIG. 4B also illustrates the data being modelled from a sinusoidal fit. A sinusoidal model can be applied to calculate X and Y offsets from the total offset curve. FIG. 5 is a model description, though other models may be possible. When there is offset in both X and Y in FIG. 5, a=A cos (θ−Φ)+C. A, Φ, and C are the unknowns. In FIG. 5, θ is measured with respect to horizontal axis, Φ is an angle between a line joining two centers and a horizontal axis, C1 is the center of the top wafer, C2 is the center of the carrier wafer, A is the distance between the centers of the two wafers, X is the X offset between the two wafers, and Y is the Y offset between the two wafers. From a modeled fit, the top wafer offsets with respect to the carrier wafer is calculated as follows.

Xoffset_top(μm)=A cos Φ*pixel_size

Yoffset_top(μm)=A sin Φ*pixel_size

C can be ignored in some simple cases. The pixel size may be, for example, 2.408 μm, though other sizes are possible.

Input parameters for this embodiment that isolates vertically-connected pixels can include slope tolerance and zone. For slope tolerance, a user can set how much tolerance is allowed from a perfect vertical line. For zone, a user can define top and bottom wafer zones for accurate computation during grouping.

Since the offset between two wafers in a bonded wafer is calculated from a single image, any wafer-to-stage placement error does not impact computations involved in isolating vertically-connected pixels. Thus, any wafer placement on a stage may be acceptable. This measurement also is free from any shift in the image coordinate space due to calibration drifts because the difference between two averages is calculated to have the offset curve. Thus, the difference will not be impacted even if the individual averages change because of the drift.

In an instance, the embodiment of FIGS. 2-5 may include a step to remove messy edges or artifacts. This may occur prior to finding the vertical line segments. In another instance, a wafer edge profile image with messy edges or artifacts can be skipped and other wafer edge profile images of a wafer can be relied upon instead.

In another embodiment, shown in FIGS. 6-12, a model-based approach is used. In a pre-processing step, the contour coordinates of the edge profile images are extracted. The coordinates for wafer bevel and apex are then used to fit an elliptical model.

Figure 6:
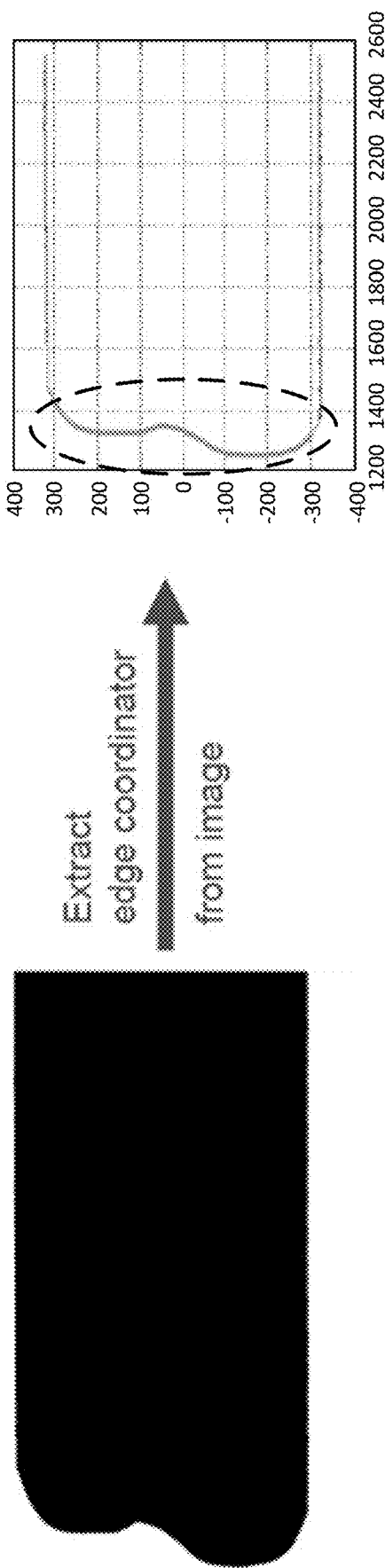
FIG. 6 includes an exemplary wafer edge profile image of a circumferential edge of a wafer on the left and extracted edge contour coordinates from the wafer edge profile image on the right.

FIG. 6 includes an exemplary wafer edge profile image of a circumferential edge of a wafer on the left and extracted edge contour coordinates from the wafer edge profile image on the right. Edge coordinates can be extracted from the wafer edge profile image using, for example, a high pass filter. Stage effects can be corrected. Coordinates of points at the bevel and apex (circled with the dotted line in FIG. 6) can be saved or otherwise noted. This process can be repeated for all wafer edge profile images for a wafer (e.g., every 10 degrees around the circumference of the bonded wafer). At least three images may be needed to provide the relative center offset, but more images can proved higher accuracy in terms of reduce roughness at the edge or the circularity error. For example, 36 images may be taken.

Figure 7:
FIG. 7 illustrates an algorithm analyzing the wafer edge profile image of FIG. 6 slice by slice.
Figure 8:
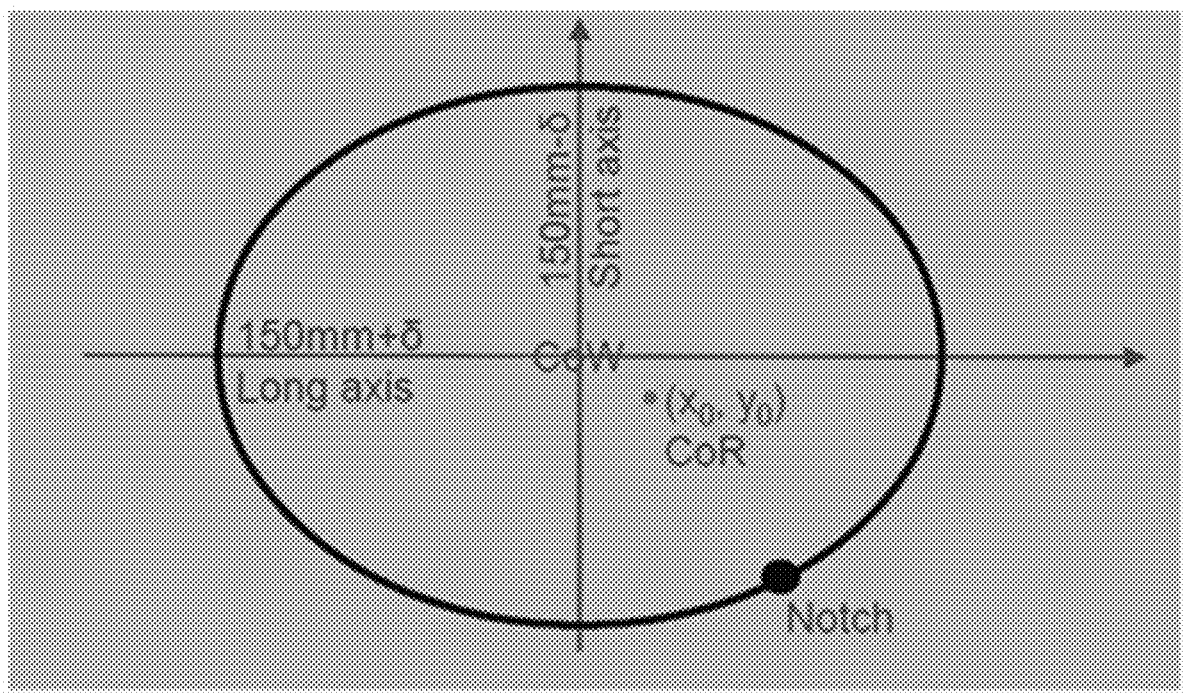
FIG. 8 is a model description in accordance with the present disclosure.
Figure 9:
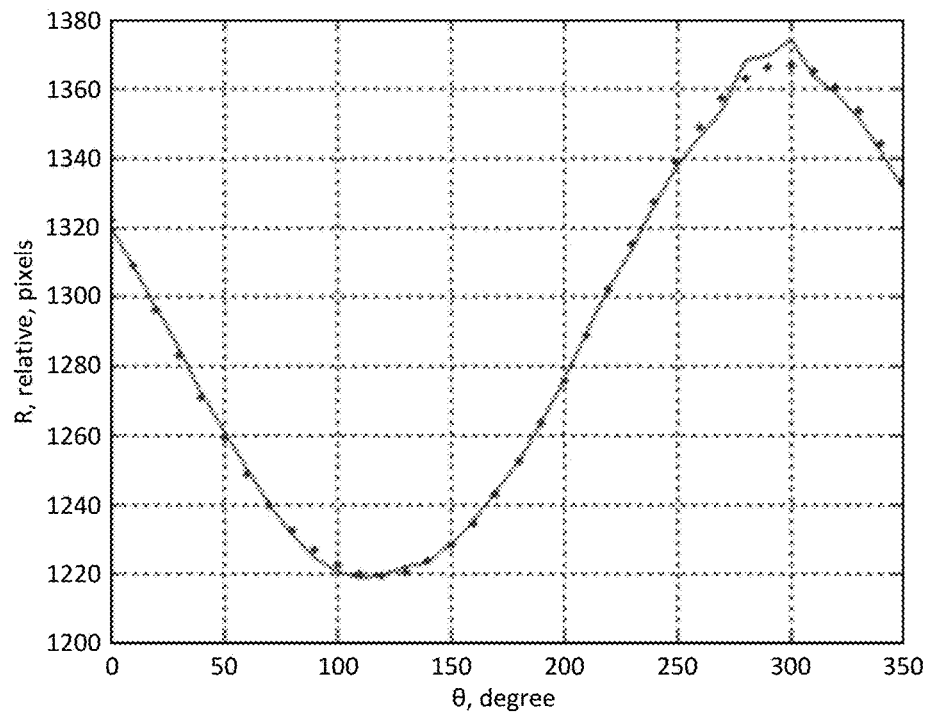
FIG. 9 is edge data and model fit results, wherein the radius is shown as a function of the angle.
Figure 10:
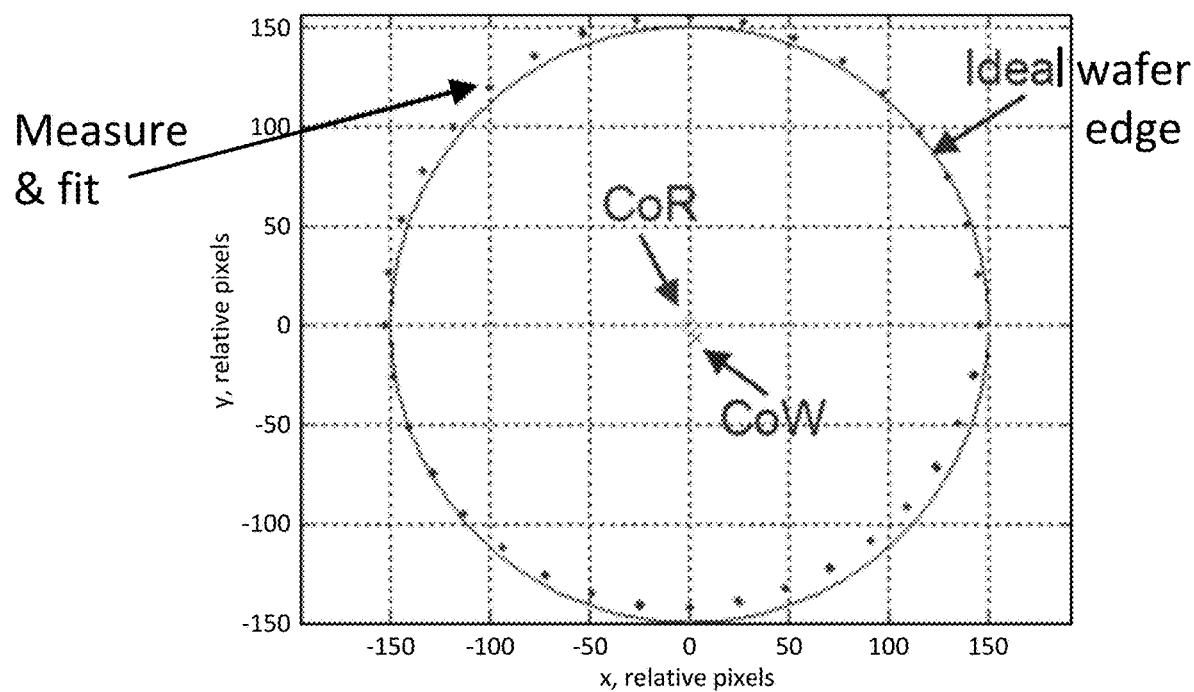
FIG. 10 is edge data and model fit results, wherein the model results are shown.

Edge data can then be fitted to a model. FIG. 7 illustrates an algorithm analyzing the wafer edge profile image of FIG. 6 slice by slice. The coordinates are fitted to an elliptical model, such as that illustrated in FIG. 8, on a slice-by-slice basis. In FIG. 8, CoR is the center of rotation and CoW is the center of the wafer. This results in a center of wafer per slice, as shown in FIGS. 9-10. A typical step size may be 2.5 microns. For each slice, there may be 36 edge position points, though other values or ranges are possible. Each point comes from one image. Its coordinate can be the orientation (θ) and radius, shown as solid line in FIG. 9. Then these points are fitted into a model, as seen in FIG. 8. The parameters of the model include CoR and CoW currently set as the reference. The wafer circularity is modeled as an ellipse with its long axis R+δ, and short axis R−δ. Given a hypotheses model parameters, the position of images is calculated, shown as dots in FIG. 9. A non-linear regression algorithm can be used to adjust the hypotheses model parameters so that the model prediction (dots in FIG. 9) is best matched with the measured value (solid line in FIG. 9). The model parameters that give best match are reported as the measurement results, in terms of CoR, wafer radius, wafer ellipticity as shown in FIG. 8.

For example, using least-squares fitting, the center positions of the wafers are calculated from the results of the slices. The calculated center positions are sorted into N sets where N is the number of wafers in a bonded wafer (i.e., N>1). The sorting may be done using knowledge of wafer thicknesses and/or filtering. Filtering can include deviation from median and/or knowledge about the height location. The center positions of each wafer can be calculated for each set corresponding to a wafer by averaging, using a median, or with other techniques.

Figure 11:
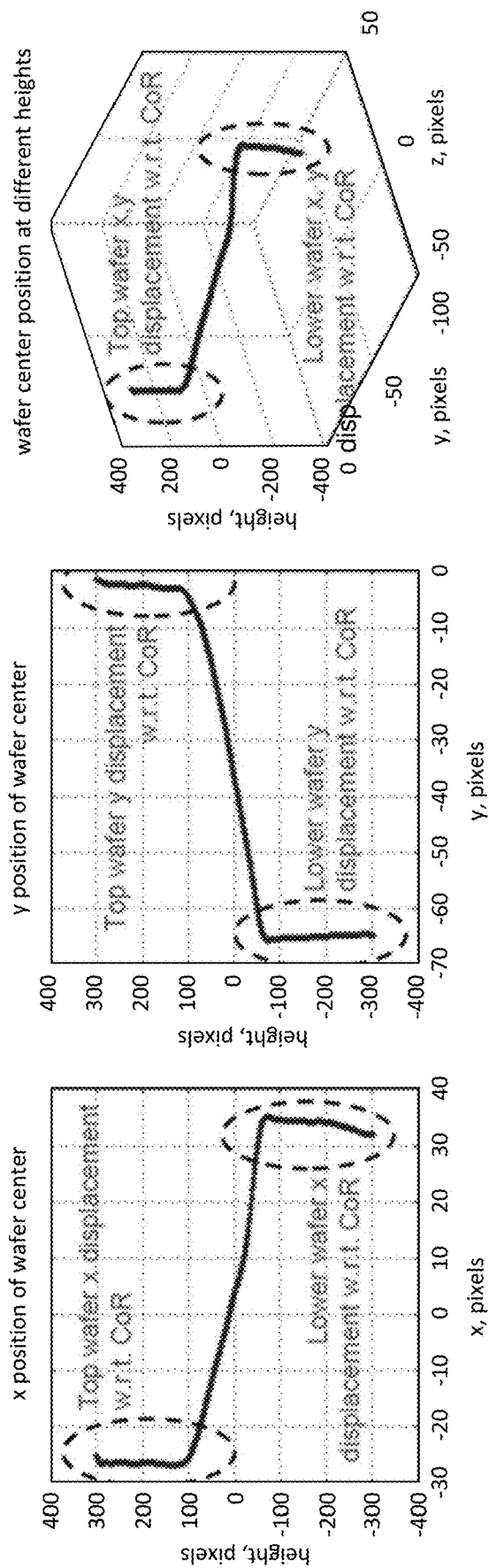
FIGS. 11-12 illustrates wafer radius and circularity results.
Figure 12:
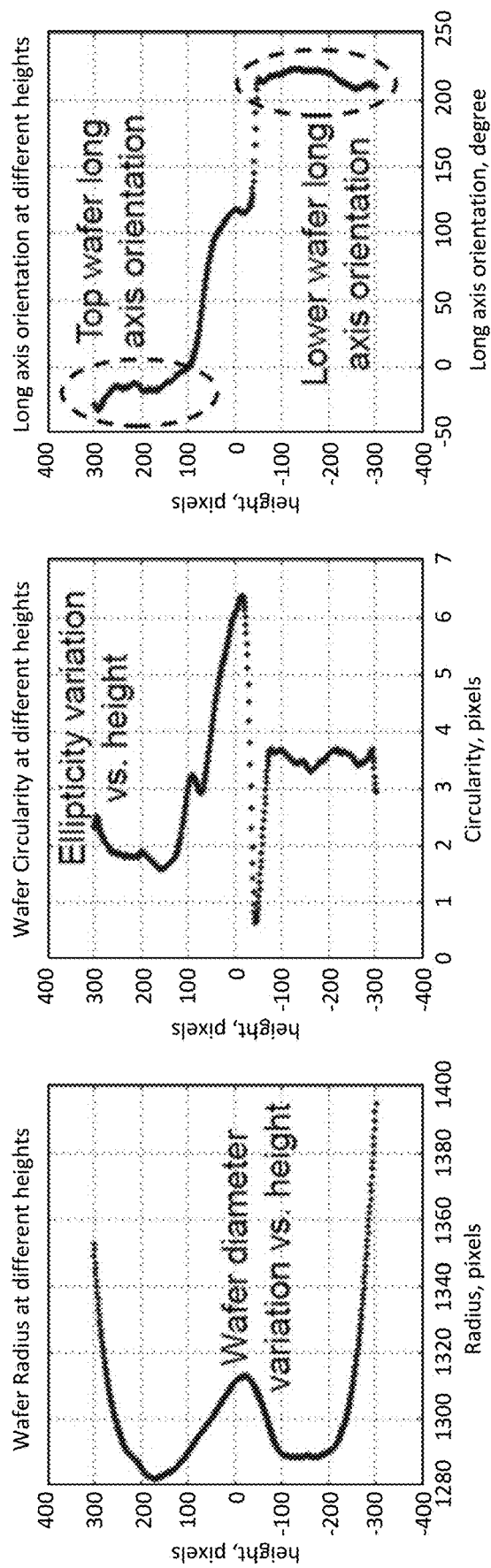

FIGS. 11-12 illustrate wafer radius and circularity results. The calculated wafer centers with respect to the center of rotation in FIG. 11 and FIG. 12 show the wafer radius at different slices and the ellipticity.

The embodiment of FIGS. 6-12 may use an elliptical model. In an instance, the ellipse equation is $Ax^2+Bxy+Cy^2+Dx+Ey+F=0$. This may provide improved results because the wafers may not be perfectly circular. However, other models (e.g., a circular model) may still provide acceptable performance.

While the embodiments of FIG. 2-5 and FIGS. 6-12 can be used separately or in the alternative, both the embodiment of FIGS. 2-5 and the embodiment of FIGS. 6-12 may be used together. For example, the embodiment of FIGS. 6-12 may be performed first. Then the embodiment of FIGS. 2-5 may be performed to verify results. The embodiments of FIGS. 6-12 may provide more accurate results because its analysis includes more non-ideal factors in the model, may provide more information because detailed edge information is preserved in the analysis process, and may be faster.

In another example, the embodiment of FIGS. 2-5 may be a backup if the embodiment of FIGS. 6-12 is unable to provide acceptable or clear results.

In the embodiments disclosed herein, the wafer edge data/coordinates are acquired using wafer edge profile images. A profiler, laser triangulation, or other techniques could be used to generate the inputs instead.

Figure 13:
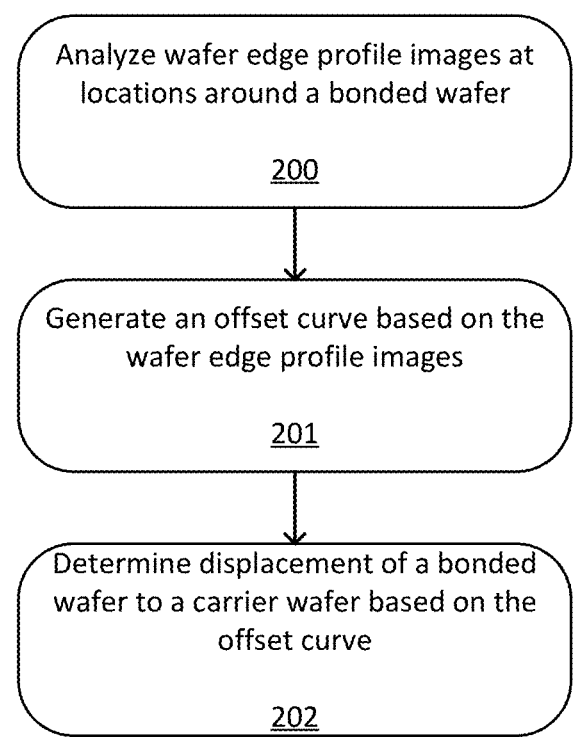
FIG. 13 is a flowchart of an embodiment of a method in accordance with the present disclosure.

FIG. 13 is a flowchart of an embodiment of a bonded wafer metrology method. At 200, wafer edge profile images are analyzed at locations around a bonded wafer, which may have a top wafer and a carrier wafer. At 201, an offset curved is generated based on the wafer edge profile images. At 202, displacement of the top wafer to the carrier wafer is determined based on the offset curve. The wafer edge profile images may be generated at multiple locations around the wafer prior to the analysis 200. The wafer edge profile images may be shadowgram images.

While two wafers (e.g., a carrier wafer and a top wafer) are illustrated, more than two wafers may be bonded together. For example, three wafers may be bonded to a carrier wafer. The offset between adjacent wafer, between pairs of wafers, or for the overall bonded wafer can be calculated.

In an instance of the analyzing 200, a first vertical line segment in each of the edge profile images for the top wafer is determined and a second vertical line segment in each of the edge profile images for the carrier wafer is determined. The lateral position of the first vertical line segment and the second vertical line segment is compared for each of the edge profile images. Determining the first vertical line segment and the determining the second vertical line segment can include isolating vertically connected pixels along a contour of the wafer edge profile images using a Hough Transform. A sinusoidal model may be used to determine the displacement.

In another instance of the analyzing 200, edge coordinates are extracted from each of the edge profile images. Coordinates of points at a bevel and an apex in each of the edge profile images are determined. The coordinates are fitted to an elliptical model. A center position of the top wafer and the carrier wafer is calculated. Stage effects can be corrected after the extracting.

Additional wafer properties can be obtained from the image analysis, such as wafer circularity or other irregularities such as the shape of the individual wafer edges. For example, whether the wafer edge is angled and the direction of the angle can be determined. Thus, the systems and methods disclosed herein can be used for concurrent wafer edge inspection and edge profiling.

Figure 14:
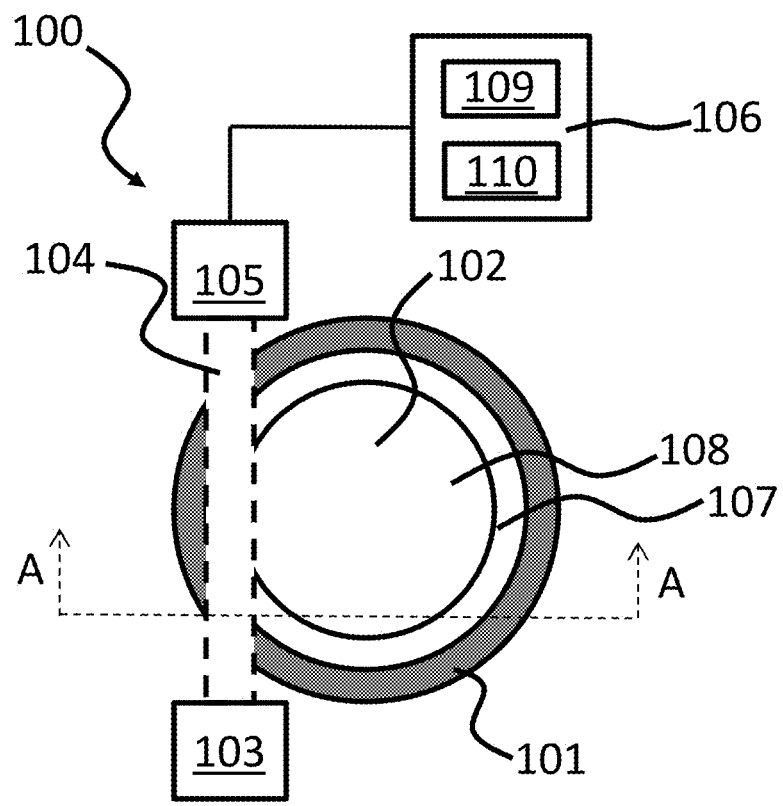
FIGS. 14-15 are a top view and corresponding cross-sectional side view along A-A of a block diagram of a system in accordance with an embodiment of the present disclosure.
Figure 15:
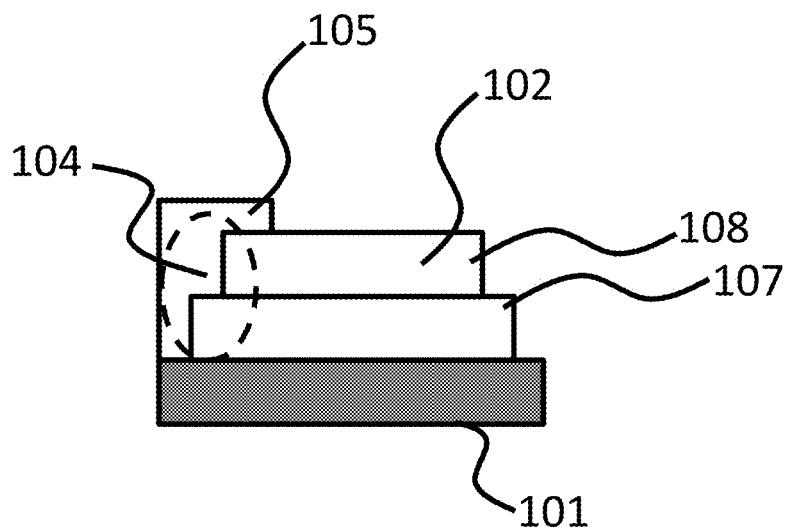
Figure 16:
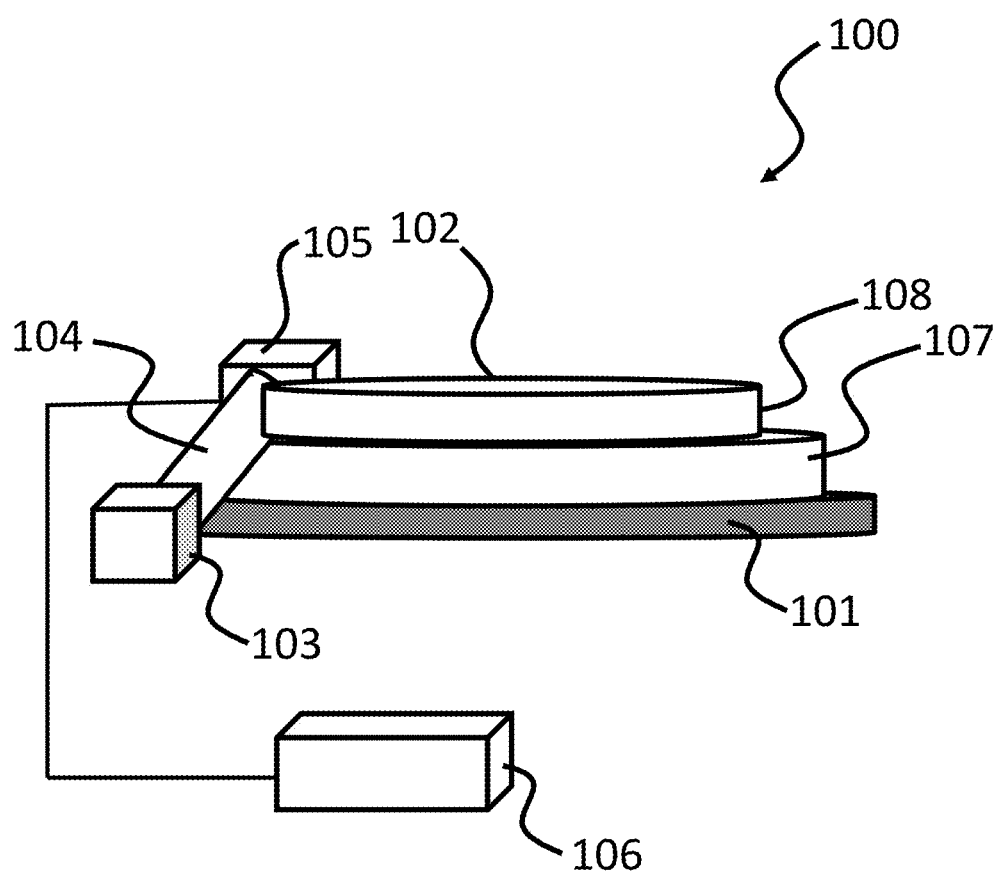
FIG. 16 is a perspective view of a system corresponding to the embodiment of FIGS. 14-15.

FIGS. 14-15 are a top view and corresponding cross-sectional side view along A-A of a block diagram of a system 100 in accordance with an embodiment of the present disclosure. FIG. 16 is a perspective view of a system 100 corresponding to the embodiment of FIGS. 14-15. System 100 is configured to perform metrology of a bonded wafer by acquiring images that are shadowgrams. A shadowgram applies a shadowgraph technique and visualizes or images a shadow of the bonded wafer 102, such as a circumferential edge of the bonded wafer 102. A stage 101 can be configured to rotate a bonded wafer 102, though the system 100 also can rotate with respect to the bonded wafer 102. Such rotation can be stepped or continuous. The bonded wafer 102 also may not rotate during imaging and components of the system 100 may be fixed.

The exemplary bonded wafer 102 is shown with a carrier wafer 107 and a top wafer 108. The carrier wafer 107 and top wafer 108 may have different diameters, such as those illustrated in FIG. 1. For example, the carrier wafer 107 can be a carrier wafer and the top wafer 108 can be a device wafer. Alternatively, the carrier wafer 107 and top wafer 108 can both be device wafers or more than the carrier wafer 107 and top wafer 108 can form the bonded wafer 102.

A light source 103 is configured to direct collimated light 104 at an edge of the bonded wafer 102. In some embodiments, the collimated light 104 is directed tangentially, with respect to the bonded wafer 102, so as to create a shadow of the edge profile. Thus, the bonded wafer 102 blocks some of the collimated light 104. The collimated light 104 is illustrated as approximately circular, but can be other shapes. In an exemplary embodiment, the light source 103 utilizes a light-emitting diode (LED). Other suitable light sources 103, such as a lamp that produces collimated light, laser, super-continuum laser, laser-driven phosphor, or laser-driven lamp, will be apparent in light of the present disclosure. Combinations of light sources 103, such as a laser and an LED, may be utilized. The light source 103 can include both single band and broadband light sources in a single system or multiple systems. The collimated light 104 may be parallel to a plane of the bonded wafer 102. For example, the collimated light 104 may be parallel to the plane of the carrier wafer 107 on which the top wafer 108 is disposed. Diffraction suppression techniques may be used to remove diffraction-related artifacts that may adversely affect measurements. Approximately a few millimeters of the bonded wafer 102 are seen in a profile using the collimated light 104, though other dimensions are possible.

A detector 105 located apart from the light source 103 receives at least some of the collimated light 104. The detector 105 is located such that when a bonded wafer 102 is being imaged, at least a portion of the shadow (i.e., the light producing the shadow) is received by the detector 105. The detector 105 can be, for example, a charge-coupled device (CCD) or complementary metal-oxide-semiconductor (CMOS) camera. In this way, an image of the wafer edge silhouette is formed (i.e., a wafer edge profile image). The detector 105 can be configured to collect hundreds of wafer edge profile images of the bonded wafer 102 for high sampling. For example, between 2 and 500 wafer edge profile image of the bonded wafer 102 may be collected, though more images can be collected. In an example, 16 wafer edge profile images of a bonded wafer are collected. In another example, 36 wafer edge profile images of a bonded wafer are collected. In another example, 360 wafer edge profile images of a bonded wafer are collected.

The collimated light 104 may have a wavelength or wavelengths that produce a shadow. For example, visible light such as blue light or white light may be used. Other suitable collimated light 104 will be apparent in light of the present disclosure. For example, ultraviolet light can be used. The collimated light 104 may be polarized and may be pulsed or continuous.

While only a single light source 103 and detector 105 are illustrated in FIGS. 14-16, multiple light sources 103 and detectors 105 may be used. Multiple light sources 103 and detectors 105 may be placed at various locations around the perimeter of the bonded wafer 102 to collect images at different locations of the bonded wafer 102. This may increase inspection throughput or increase the number of images produced while minimizing the impact to inspection throughput. If multiple light sources 103 and detectors 105 are placed at various locations around the perimeter of the bonded wafer 102, then the bonded wafer 102 may not rotate with respect to the light source 103 or detector 105.

A controller 106 is operatively connected to the detector 105. The controller 106 is configured to analyze an image of the edge of the bonded wafer 102 and can control the acquisition of the images using the detector 105. For example, the controller 106 can rotate the bonded wafer 102 with respect to the light source 103 or detector 105. The controller 106 also can control the timing or locations of image acquisition on the bonded wafer 102. The controller 106 may be configured to perform other functions or additional steps using the output of the detector 105. For example, the controller 106 may be programmed to perform some or all of the steps of FIG. 13. The controller 106 can include a processor 109 and a memory 110.

The controller 106, other system(s), or other subsystem(s) described herein may take various forms, including a personal computer system, workstation, image computer, mainframe computer system, workstation, network appliance, internet appliance, parallel processor, or other device. In general, the term "controller" may be broadly defined to encompass any device having one or more processors that executes instructions from a memory medium. The subsystem(s) or system(s) may also include any suitable processor known in the art, such as a parallel processor. In addition, the subsystem(s) or system(s) may include a platform with high speed processing and software, either as a standalone or a networked tool.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

In another embodiment, the controller 106 may be communicatively coupled to any of the various components or sub-systems of system 100 in any manner known in the art. Moreover, the controller 106 may be configured to receive and/or acquire data or information from other systems by a transmission medium that may include wireline and/or wireless portions. In this manner, the transmission medium may serve as a data link between the controller 106 and other subsystems of the system 100 or systems external to system 100.

An additional embodiment relates to a non-transitory computer-readable medium storing program instructions executable on a controller for performing a computer-implemented method for bonded wafer metrology, such as for performing the techniques disclosed herein. In particular, as shown in FIG. 14, the controller 106 can include a memory 110 or other electronic data storage medium with non-transitory computer-readable medium that includes program instructions executable on the controller 106. The computer-implemented method may include any step(s) of any method(s) described herein, such as that disclosed with respect to FIG. 13. The memory 110 or other electronic data storage medium may be a storage medium such as a read-only memory, a random access memory, a magnetic or optical disk, a non-volatile memory, a solid state memory, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), SSE (Streaming SIMD Extension), or other technologies or methodologies, as desired.

In some embodiments, various steps, functions, and/or operations of system 100 and the methods disclosed herein are carried out by one or more of the following: electronic circuits, logic gates, multiplexers, programmable logic devices, application-specific integrated circuits (ASICs), analog or digital controls/switches, microcontrollers, or computing systems. Program instructions implementing methods such as those described herein may be transmitted over or stored on carrier medium. A carrier medium may include an electronic data storage medium, such as that of the memory 110, or a transmission medium such as a wire, cable, or wireless transmission link. For instance, the various steps described throughout the present disclosure may be carried out by a single controller 106 (or computer system) or, alternatively, multiple controllers 106 (or multiple computer systems). Moreover, different sub-systems of the system 100 may include one or more computing or logic systems. Therefore, the above description should not be interpreted as a limitation on the present invention but merely an illustration.

As used throughout the present disclosure, a "wafer" may refer to a substrate formed of a semiconductor or non-semiconductor material. For example, a semiconductor or non-semiconductor material may include, but is not limited to, monocrystalline silicon, gallium arsenide, or indium phosphide. A wafer may include one or more layers. For example, such layers may include, but are not limited to, a resist, a dielectric material, a conductive material, or a semiconductive material. Many different types of such layers are known in the art, such as, but not limited to, isolation layers, implantation layers, and the like. The term "wafer" as used herein is intended to encompass a substrate on which any of such layers may be formed.

Each of the steps of the method may be performed as described herein. The methods also may include any other step(s) that can be performed by the controller and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A metrology system comprising:
a stage configured support a bonded wafer, wherein the bonded wafer has a top wafer disposed on a carrier wafer;
an imaging system configured to generate wafer edge profile images of a circumferential edge of the bonded wafer, wherein the imaging system includes a light source configured to generate collimated light and a detector configured to generate the wafer edge profile images; and
a controller in electronic communication with the imaging system, wherein the controller is programmed to:
analyze the wafer edge profile images at a plurality of locations around the bonded wafer;
generate an offset curve based on the wafer edge profile images; and
determine a displacement of the top wafer to the carrier wafer based on the offset curve;
wherein during the analyzing, the controller is further configured to:
extract edge coordinates from each of the wafer edge profile images;
determine coordinates of points at a bevel and an apex in each of the wafer edge profile images;
fit the bevel coordinates and the apex coordinates to an elliptical model; and
calculate a center position of the top wafer and the carrier wafer.

2. The metrology system of claim 1, wherein the wafer edge profile images are shadowgram images.

3. The metrology system of claim 1, wherein during the analyzing, the controller is further configured to:
determine a first vertical line segment in each of the wafer edge profile images for the top wafer;
determine a second vertical line segment in each of the wafer edge profile images for the carrier wafer; and
compare the lateral position of the first vertical line segment and the second vertical line segment for each of the wafer edge profile images.

4. A method comprising:
analyzing, with a controller, wafer edge profile images at a plurality of locations around a bonded wafer, wherein the bonded wafer has a top wafer disposed on a carrier wafer, and wherein the analyzing includes:
extracting edge coordinates from each of the wafer edge profile images;
determining coordinates of points at a bevel and an apex in each of the wafer edge profile images;
fitting the bevel coordinates and the apex coordinates to an elliptical model; and
calculating a center position of the top wafer and the carrier wafer;
generating, with the controller, an offset curve based on the wafer edge profile images; and
determining, with the controller, a displacement of the top wafer to the carrier wafer based on the offset curve.

5. The method of claim 4, further comprising generating the wafer edge profile images at the plurality of locations around the bonded wafer.

6. The method of claim 4, wherein the wafer edge profile images are shadowgram images.

7. The method of claim 4, wherein the analyzing further comprises:
determining a first vertical line segment in each of the wafer edge profile images for the top wafer;
determining a second vertical line segment in each of the wafer edge profile images for the carrier wafer; and
comparing the lateral position of the first vertical line segment and the second vertical line segment for each of the wafer edge profile images.

8. The method of claim 7, wherein the determining the first vertical line segment and the determining the second vertical line segment include isolating vertically connected pixels along a contour of the wafer edge profile images using a Hough Transform.

9. The method of claim 7, wherein a sinusoidal model is used to determine the displacement.

10. The method of claim 4, further comprising correcting for stage effects after the extracting.

11. The method of claim 4, further comprising evaluating a shape of an edge profile of the top wafer and the carrier wafer.

12. A non-transitory computer readable medium storing a program configured to instruct a processor to:
analyze wafer edge profile images at a plurality of locations around a bonded wafer, wherein the bonded wafer has a top wafer disposed on a carrier wafer, and wherein the analyzing includes:
extracting edge coordinates from each of the wafer edge profile images;
determining coordinates of points at a bevel and an apex in each of the wafer edge profile images;
fitting the bevel coordinates and the apex coordinates to an elliptical model; and
calculating a center position of the top wafer and the carrier wafer;
generate an offset curve based on the wafer edge profile images; and
determine a displacement of the top wafer to the carrier wafer based on the offset curve.

13. The non-transitory computer readable medium of claim 12, wherein the wafer edge profile images are shadowgram images.

14. The non-transitory computer readable medium of claim 12, wherein the analyzing the displacement includes:
determining a first vertical line segment in each of the wafer edge profile images for the top wafer;
determining a second vertical line segment in each of the wafer edge profile images for the carrier wafer; and
comparing the lateral position of the first vertical line segment and the second vertical line segment for each of the wafer edge profile images.

15. The non-transitory computer readable medium of claim 14, wherein the determining the first vertical line segment and the determining the second vertical line segment include isolating vertically connected pixels along a contour of the wafer edge profile images using a Hough Transform.

16. The non-transitory computer readable medium of claim 14, wherein a sinusoidal model is used to determine the displacement.

17. The non-transitory computer readable medium of claim 12, further comprising correcting for stage effects after the extracting.

* * * * *